(12) United States Patent
Nagano et al.

(10) Patent No.: US 8,687,357 B2
(45) Date of Patent: Apr. 1, 2014

(54) ELECTRIC POWER CONVERTER

(75) Inventors: Sumiaki Nagano, Kitakyushu (JP);
Tomohiro Shigeno, Kitakyushu (JP);
Toshiaki Fujiki, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 589 days.

(21) Appl. No.: 13/018,676

(22) Filed: Feb. 1, 2011

(65) Prior Publication Data

US 2011/0188280 A1 Aug. 4, 2011

(30) Foreign Application Priority Data

Feb. 2, 2010 (JP) ................................. 2010-021648

(51) Int. Cl.
*H05K 7/20* (2006.01)
*H01L 23/40* (2006.01)

(52) U.S. Cl.
USPC ...... 361/679.47; 361/101; 361/109; 361/141; 361/679.49; 361/679.54; 361/695; 361/697; 165/80.3; 165/104.33; 165/185

(58) Field of Classification Search
USPC ........................ 361/101–147, 679.46–679.54, 361/690–697; 165/80.3, 104.33, 121–126, 165/185; 174/16.3; 454/184; D13/110
See application file for complete search history.

(56) References Cited

U.S. PATENT DOCUMENTS

| | | | | |
|---|---|---|---|---|
| 4,459,638 A | * | 7/1984 | Brehm et al. | 361/697 |
| 4,520,425 A | * | 5/1985 | Ito | 361/697 |
| 4,525,769 A | * | 6/1985 | Lehmann | 361/704 |
| 4,620,263 A | * | 10/1986 | Ito | 361/690 |
| 6,091,604 A | * | 7/2000 | Plougsgaard et al. | 361/707 |
| 6,233,149 B1 | * | 5/2001 | Bailey et al. | 361/704 |
| 6,320,776 B1 | * | 11/2001 | Kajiura et al. | 363/141 |
| 6,362,594 B2 | * | 3/2002 | Kajiura | 320/104 |
| 6,493,227 B2 | * | 12/2002 | Nielsen et al. | 361/703 |
| 6,504,714 B1 | * | 1/2003 | Richter | 361/695 |
| 6,862,182 B1 | * | 3/2005 | Roman et al. | 361/697 |
| 6,870,737 B2 | * | 3/2005 | Hashimoto et al. | 361/709 |
| 7,205,740 B1 | * | 4/2007 | Wei et al. | 318/473 |
| 7,265,981 B2 | * | 9/2007 | Lee | 361/707 |
| 7,272,004 B2 | * | 9/2007 | Hirota et al. | 361/695 |
| D563,317 S | * | 3/2008 | Higuchi | D13/110 |
| D603,335 S | * | 11/2009 | Hartmann et al. | D13/110 |

(Continued)

FOREIGN PATENT DOCUMENTS

JP 06315265 A * 11/1994
JP 2007-129838 5/2007

*Primary Examiner* — Michail V Datskovskiy
(74) *Attorney, Agent, or Firm* — Ditthavong Mori & Steiner, P.C.

(57) ABSTRACT

An electric power converter includes a cooler and an electronic circuit. The cooler includes a heat sink, a cooling fan, and a wind tunnel. A plurality of radiator fins are provided on a heat-sink base in the heat sink. The cooling fan is configured to feed cooling air through the plurality of radiator fins. The wind tunnel covers the plurality of radiator fins and the cooling fan. The electronic circuit includes a plurality of rectifiers and a plurality of input terminals. The plurality of rectifiers are provided on a side of the heat-sink base opposite to the plurality of radiator fins and are arranged side by side in a longitudinal direction of the heat-sink base. The plurality of input terminals are connected to the plurality of rectifiers with band-shaped conductors and are provided on a side of the plurality of rectifiers opposite to the heat sink.

4 Claims, 8 Drawing Sheets

(56) References Cited

U.S. PATENT DOCUMENTS

| | | | |
|---|---|---|---|
| 7,626,818 B2 * | 12/2009 | Yoshida et al. | 361/695 |
| 7,898,806 B2 * | 3/2011 | Isomoto | 361/697 |
| 7,957,143 B2 * | 6/2011 | Isomoto | 361/697 |
| 8,363,408 B2 * | 1/2013 | Zheng | 361/713 |
| 2006/0120001 A1 * | 6/2006 | Weber et al. | 361/103 |
| 2009/0268405 A1 * | 10/2009 | Kaveh | 361/697 |

* cited by examiner

ELECTRIC POWER CONVERTER

CROSS-REFERENCE TO RELATED APPLICATIONS

The present application claims priority under 35 U.S.C. §119 to Japanese Patent Application No. 2010-021648 filed on Feb. 2, 2010. The contents of this application are incorporated herein by reference in their entirety.

BACKGROUND OF THE INVENTION

1. Field of the Invention

The present invention relates to an electric power converter.

2. Discussion of the Background

In recent years, electric power converters have been frequently used as drivers that control alternating-current motors. Exemplary electric power converters include those provided as integral bodies each including an alternating-current (AC)-to-direct-current (DC) converter and a DC-to-AC converter, and those provided as separate bodies of an AC-to-DC converter and a DC-to-AC converter. Particularly in a case where a large capacity is required, AC-to-DC converters and DC-to-AC converters provided as separate bodies may be connected in parallel, according to the required capacity. Therefore, it is desired that a plurality of power converters be efficiently arranged in a control box.

An exemplary electric power converter employing such an arrangement is disclosed in Japanese Unexamined Patent Application Publication No. 2007-129838 published on May 24, 2007. The exemplary electric power converter has a vertically long, book-like outer shape with a small width.

SUMMARY OF THE INVENTION

According to one aspect of the present invention, an electric power converter includes a flange plate, a cooler, and an electronic circuit. The flange plate forms a part of a casing and has a rectangular shape with a through-hole provided therein. The cooler includes a heat sink, a cooling fan, and a wind tunnel. A plurality of radiator fins are provided on a heat-sink base fitted in the through-hole of the flange plate in the heat sink. The cooling fan is configured to feed cooling air through the plurality of radiator fins. The wind tunnel is provided on the heat-sink base and covers the plurality of radiator fins and the cooling fan. The electronic circuit includes a plurality of rectifiers and a plurality of input terminals. The plurality of rectifiers are provided on a side of the heat-sink base opposite to the plurality of radiator fins. The plurality of rectifiers are arranged side by side in a longitudinal direction of the heat-sink base. The plurality of input terminals are connected to the plurality of rectifiers with band-shaped conductors. The plurality of input terminals are provided on a side of the plurality of rectifiers opposite to the heat sink.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
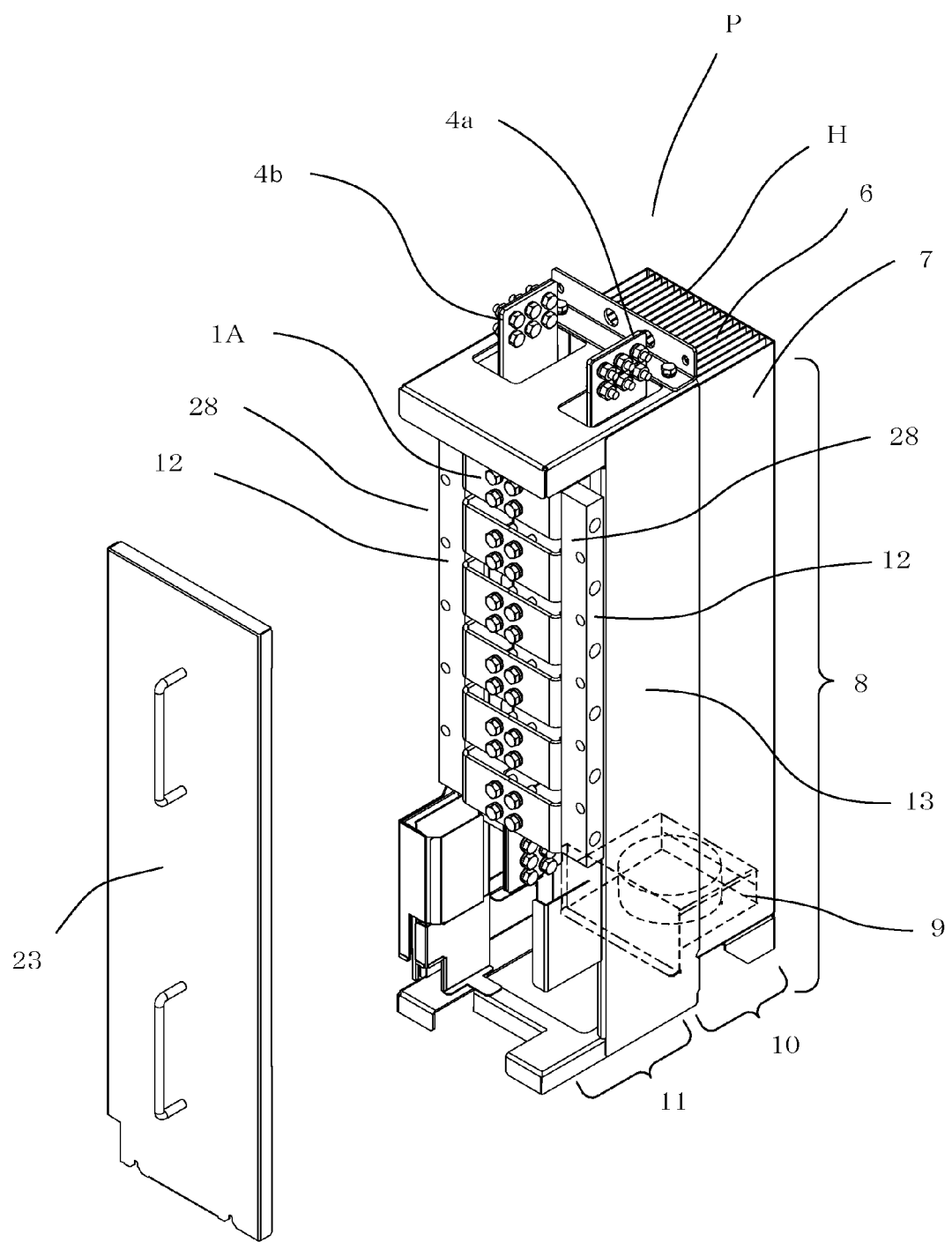
FIG. 1 is a perspective view of an electric power converter according to a first embodiment of the present invention.

Embodiments will now be described with reference to the accompanying drawings, wherein like reference numerals designate corresponding or identical elements throughout the various drawings.

First Embodiment

Figure 2:
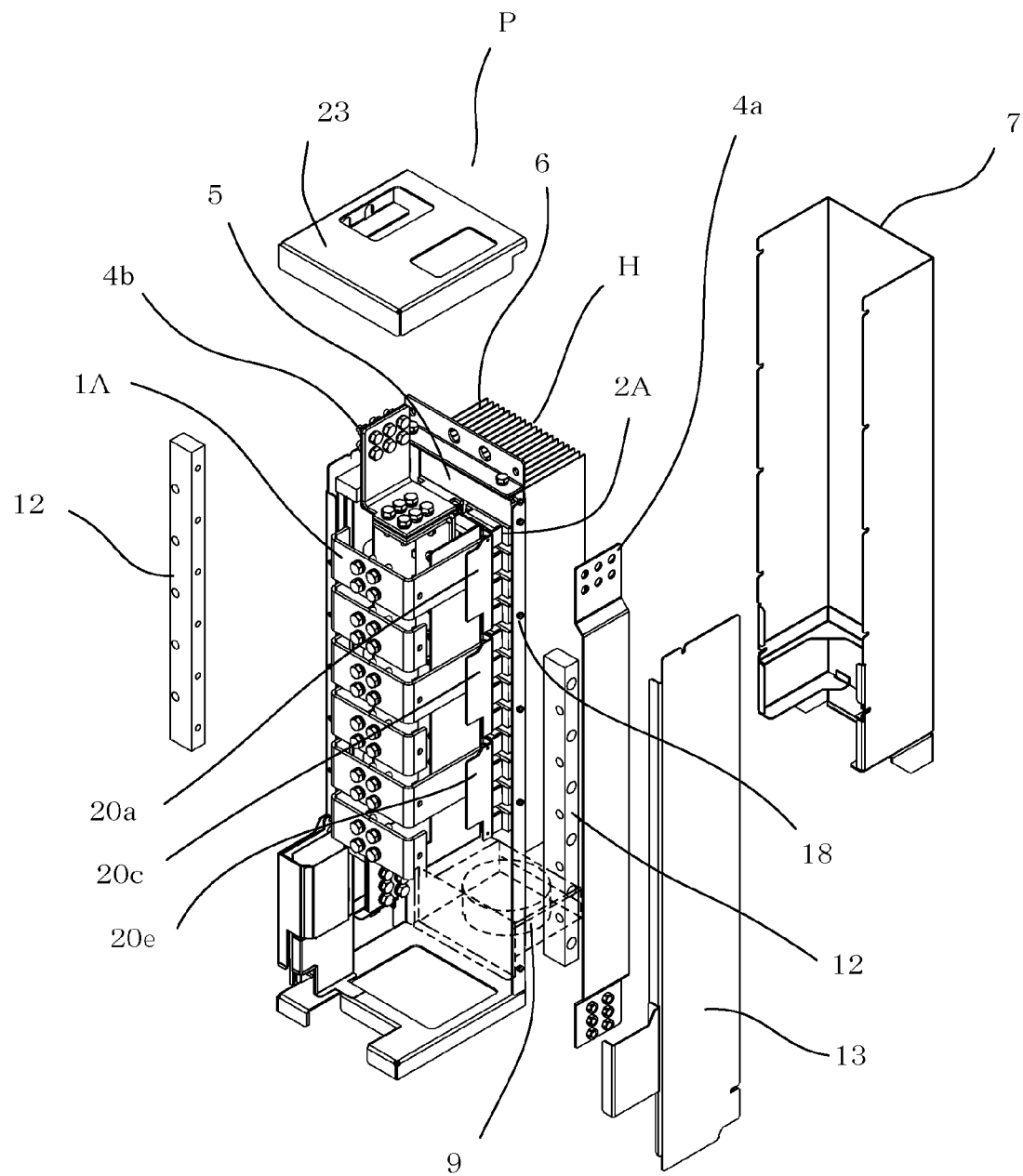
FIG. 2 is an exploded perspective view of the electric power converter shown in FIG. 1, with a face cover thereof omitted.
Figure 8:
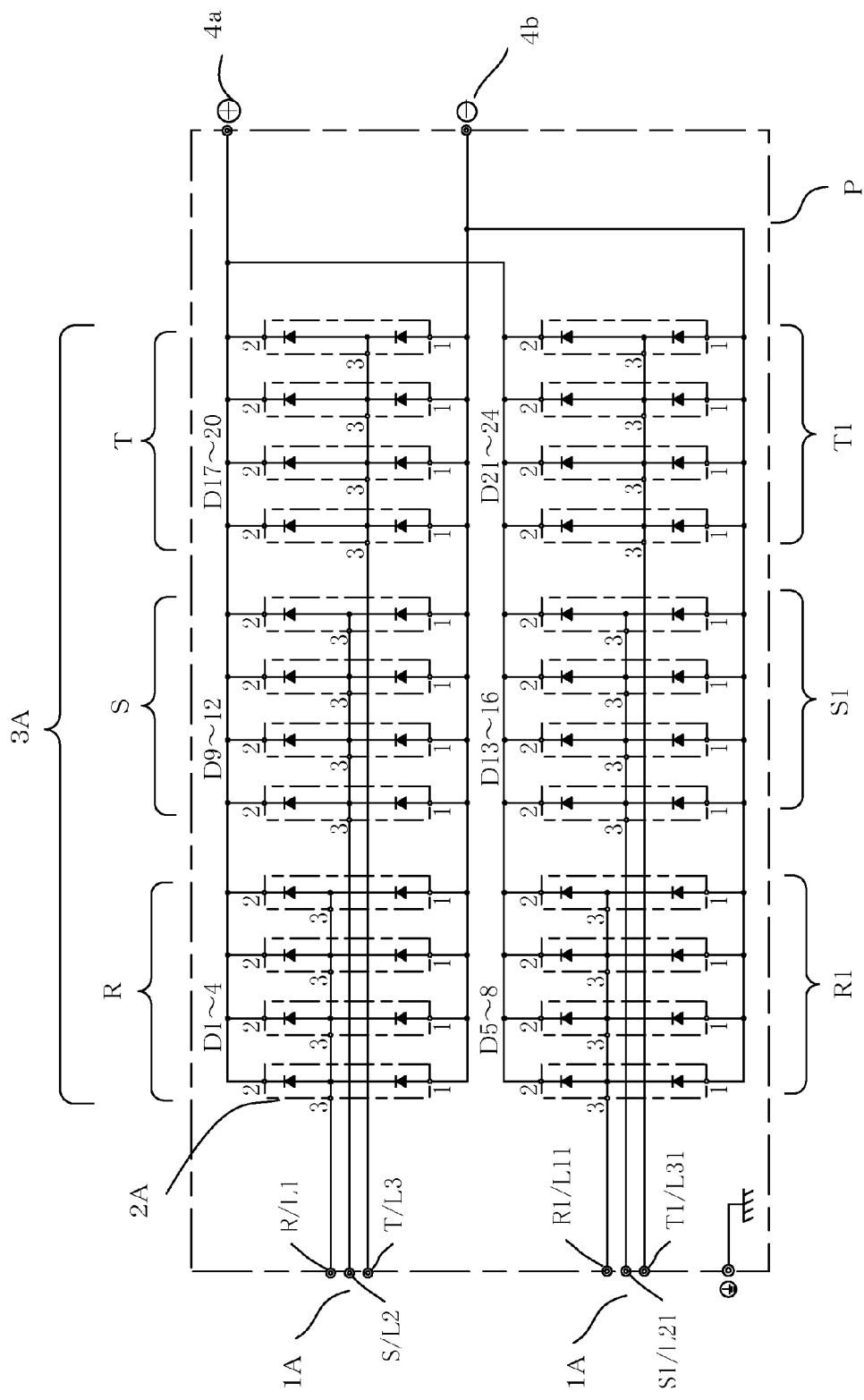
FIG. 8 is a connection diagram common to the electric power converters according to the embodiments of the present invention.

FIG. 1 is a perspective view of an electric power converter according to a first embodiment of the present invention. FIG. 2 is an exploded perspective view of the electric power converter shown in FIG. 1, with a face cover thereof omitted. FIG. 8 is a connection diagram showing the circuitry common to the electric power converters according to the following embodiments of the present invention, which are examples of a twelve-phase-rectification AC-to-DC electric power converter that converts a six-phase alternating current that is input thereto into a direct current.

Referring to FIG. 8, an alternating current that is input from input terminals 1A flows through diode bridge circuits 3A each including rectifiers 2A and is converted into a direct current. The direct current thus converted is output from a positive-phase output terminal 4a and a negative-phase output terminal 4b. In the following embodiments, four rectifiers 2A are provided in parallel for each of phases R, R1, S, S1, T, and T1, as shown in FIG. 8.

The first embodiment employing the above circuitry will now be described.

Referring to FIGS. 1 and 2, an electric power converter P includes a heat sink H. A plurality of rectifiers 2A are provided on a heat-sink base 5 of the heat sink H and are arranged side by side in the longitudinal direction of the heat-sink base 5. The heat-sink base 5 has radiator fins 6. The radiator fins 6 are covered with a wind tunnel 7 having a staple-like cross-section, for example, whereby a duct 8 is formed. A cooling fan 9 is provided below the radiator fins 6. The heat sink H, the wind tunnel 7, and the cooling fan 9 in combination form a cooler 10. In the cooler 10, the heat generated by the rectifiers 2A is transmitted through the heat-sink base 5 to the radiator fins 6; cooling air produced by the cooling fan 9 flows through the duct 8; and the heat is exhausted from the radiator fins 6 to the outside of the converter with the flow of cooling air.

The configuration of a circuit 11 will now be described.

Referring to FIG. 2, the rectifiers 2A are electrically connected to a plurality of input terminals 1A with common bus bars 20a to 20f. The common bus bars 20a to 20f are conductors such as copper bands. The input terminals 1A are provided on a side of the rectifiers 2A opposite the heat sink H, i.e., on the front side with respect to the rectifiers 2A. The input terminals 1A are also copper bands and are linearly arranged from the top toward the bottom of the electric power converter P that is in an installed state, in order of the phases R, R1, S, S1, T, and T1 shown in FIG. 8. The input terminals 1A in the form of copper bands each have a staple-like bent shape and are held by rectangular block-like insulators 12 secured to side plates 13, as shown in FIGS. 1 and 2. A face cover 23 provides a mechanical protection for the input terminals 1A. If such a mechanical protection is not necessary, the face cover 23 may be omitted.

Figure 3:
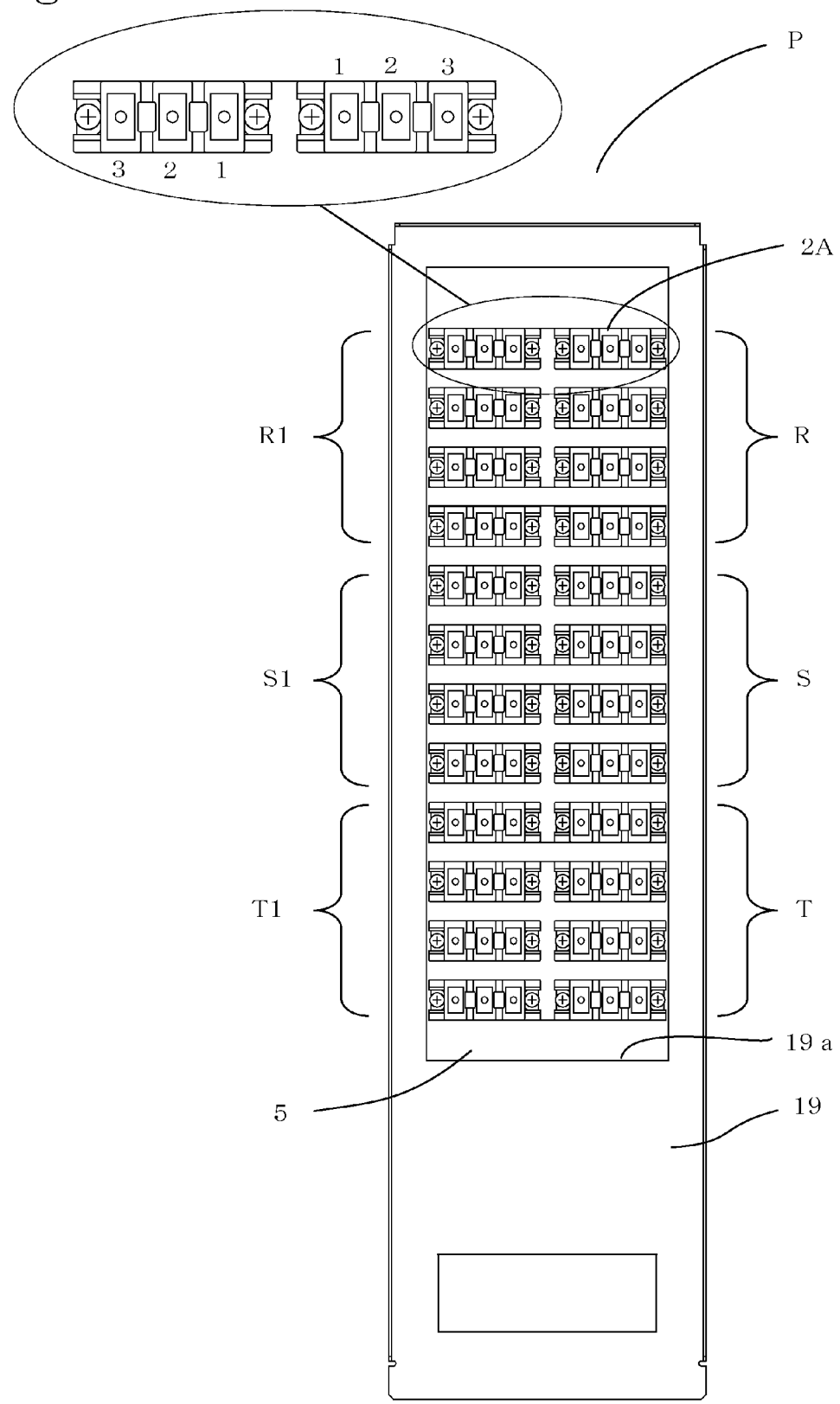
FIG. 3 is a front view showing the arrangement of rectifiers according to the first embodiment of the present invention.
Figure 4:
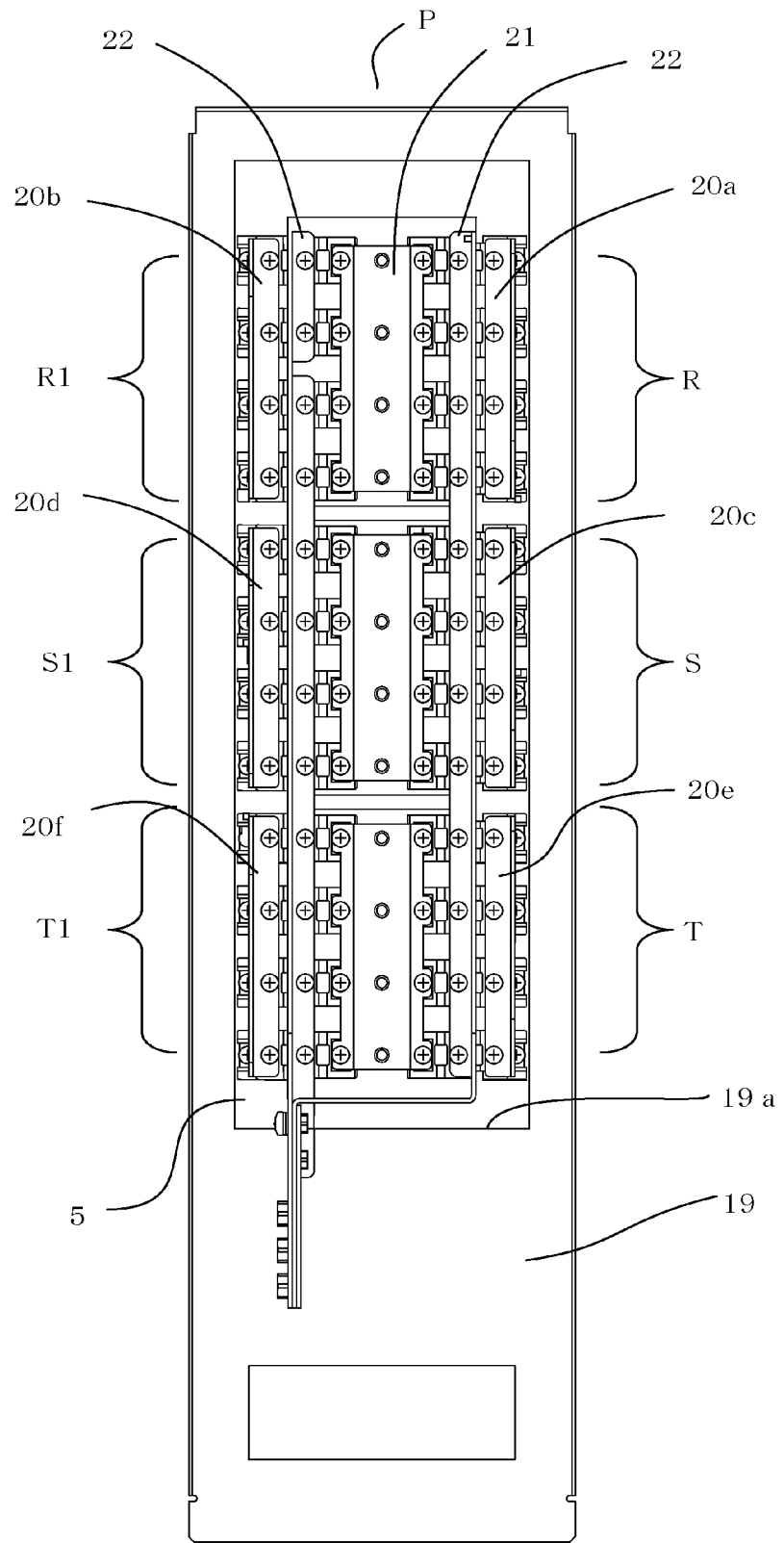
FIG. 4 is a front view showing the connections of bus bars according to the first embodiment of the present invention.
Figure 5:
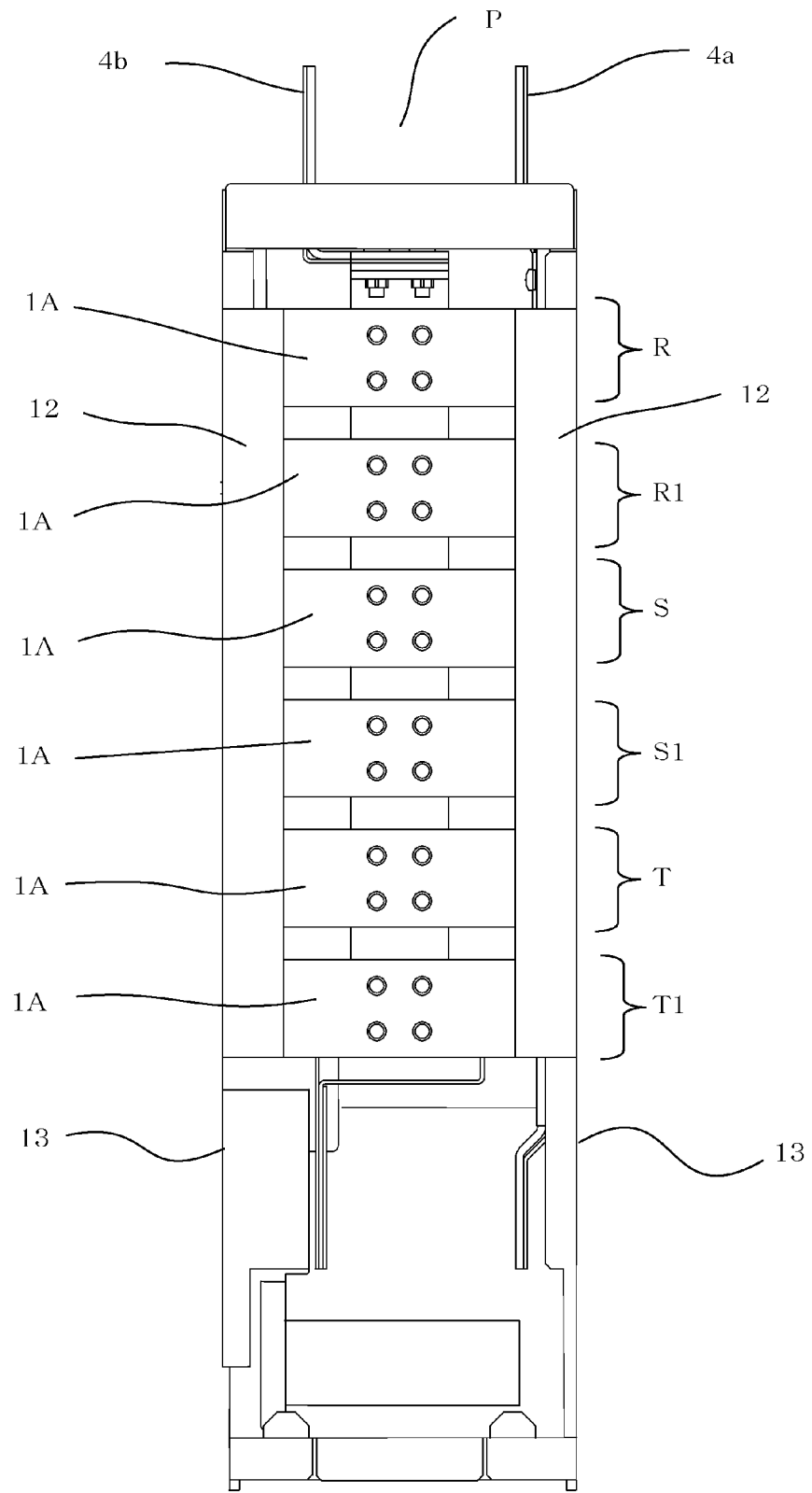
FIG. 5 is a front view showing the arrangement of input terminals according to the first embodiment of the present invention.

Referring to FIGS. 3 to 5, the arrangement of the rectifiers 2A and the connections between the rectifiers 2A and the input terminals 1A will now be described in detail. FIG. 3 is a front view of the electric power converter P according to the first embodiment of the present invention showing the arrangement of the rectifiers 2A. FIG. 4 is another front view of the electric power converter P according to the first embodiment of the present invention showing the connections of the common bus bars 20a to 20f. FIG. 5 is yet another front view of the electric power converter P according to the first embodiment of the present invention showing the arrangement of the input terminals 1A.

Referring to FIG. 3, the rectifiers 2A provided on the heat-sink base 5 are arranged side by side in the longitudinal direction of the heat-sink base 5. Four rectifiers 2A are provided in parallel for each of the six phases of the alternating-current input. That is, a total of twenty-four rectifiers 2A are provided. The rectifiers 2A are grouped by the phases R, R1, S, S1, T, and T1 as shown in FIG. 3. Terminals 1 to 3 of the rectifiers 2A correspond to reference numerals 1 to 3 shown in FIG. 8 and are arranged as shown in FIG. 3. A flange plate 19 forming a part of a casing is attached to the heat-sink base 5. The flange plate 19 has a rectangular shape with a through-hole 19a provided therein. The heat-sink base 5 is fitted in the through-hole 19a of the flange plate 19.

Referring to FIG. 4, the terminals 3 of the rectifiers 2A are connected to each other for the individual phases with the common bus bar 20a for the phase R, the common bus bar 20b for the phase R1, the common bus bar 20c for the phase S, the common bus bar 20d for the phase S1, the common bus bar 20e for the phase T, and the common bus bar 20f for the phase T1. The terminals 1 and 2 of the rectifiers 2A for all of the phases are connected to each other with a positive-phase common bus bar 22 and a negative-phase common bus bar 21.

FIG. 5 is a front view showing the arrangement of the input terminals 1A. The common bus bars 20a to 20f shown in FIG. 4 provided for common connections are connected to the input terminals 1A, respectively. The positive-phase common bus bar 22 and the negative-phase common bus bar 21 are connected to the positive-phase output terminal 4a and the negative-phase output terminal 4b, respectively. The input terminals 1A provided in the form of copper bands each having a staple-like shape as shown in FIG. 2 are arranged linearly from the top to the bottom over the rectifiers 2A in order of the phases R, R1, S, S1, T, and T1 as shown in FIG. 5. The input terminals 1A each have both ends thereof perpendicularly bent, and are held at the bent ends thereof by the block-like insulators 12 secured to the side plates 13. The side plates 13 are attached to both sides of the flange plate 19 and thus form a part of the casing of the electric power converter P.

Figure 6:
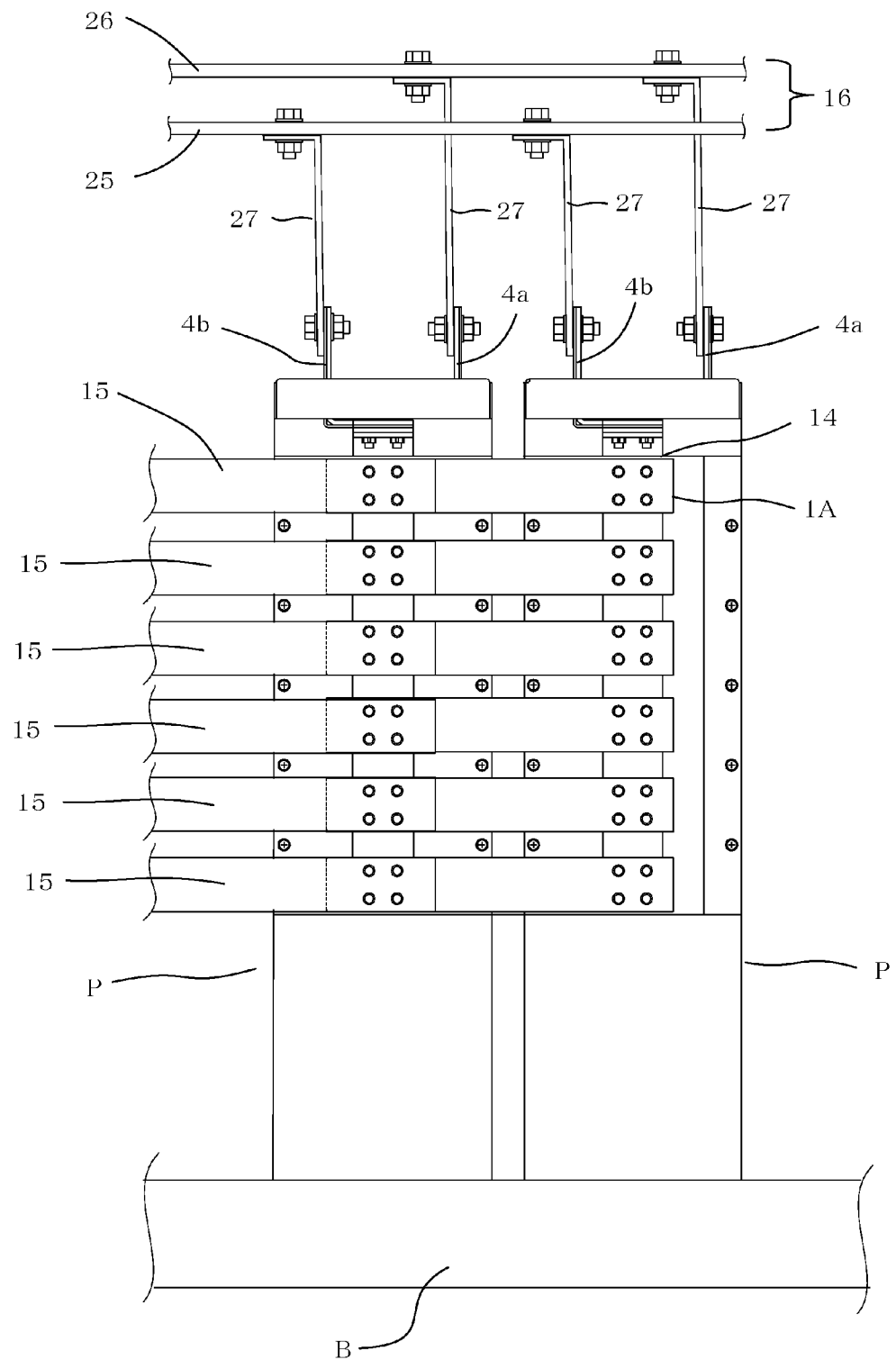
FIG. 6 is a front view of electric power converters according to the first embodiment of the present invention that are connected in parallel.

Referring to FIG. 6, an exemplary usage of the electric power converter P according to the first embodiment of the present invention will now be described.

FIG. 6 is a front view of electric power converters P according to the first embodiment of the present invention that are connected in parallel.

In this usage, two electric power converters P according to the first embodiment of the present invention are provided in parallel on an installation base B in a control box. The input terminals 1A of the two electric power converters P are connected to each other with common bus bars 14 that are band-shaped conductors. The input terminals 1A are further connected to external input terminals (not shown) provided in the control box with external-input-terminal-connecting bus bars 15. The external-input-terminal-connecting bus bars 15 are wired through wiring openings 28 provided on the right and left sides of the input terminals 1A.

The output terminals 4a and 4b provided at the top of the electric power converters P are connected to output bus bars 16 including a positive-side direct-current bus bar 26 and a negative-side direct-current bus bar 25. Specifically, the positive-phase output terminals 4a are connected to the positive-side direct-current bus bar 26 with direct-current connecting bus bars 27, and the negative-phase output terminals 4b are connected to the negative-side direct-current bus bar 25 with other direct-current connecting bus bars 27.

In this usage, the input terminals 1A of the electric power converters P are provided on the front side, and connections can be easily made through the wiring openings 28 provided on the right and left sides of the input terminals 1A. Therefore, the conductors that connect the two electric power converters P can be provided in a simple shape such as a linear band-shaped shape. In addition, no spaces are necessary for wiring, and wiring work can be performed very easily.

Furthermore, the input terminals 1A of the electric power converter P are accessible from both right and left sides thereof in the same manner. Therefore, wiring can be provided in the same manner regardless of whether the external input terminals are provided on the right side or on the left side in the control box. Even in a case where three or more electric power converters P are connected in parallel, wiring can be provided in the same manner.

Second Embodiment

Figure 7A:
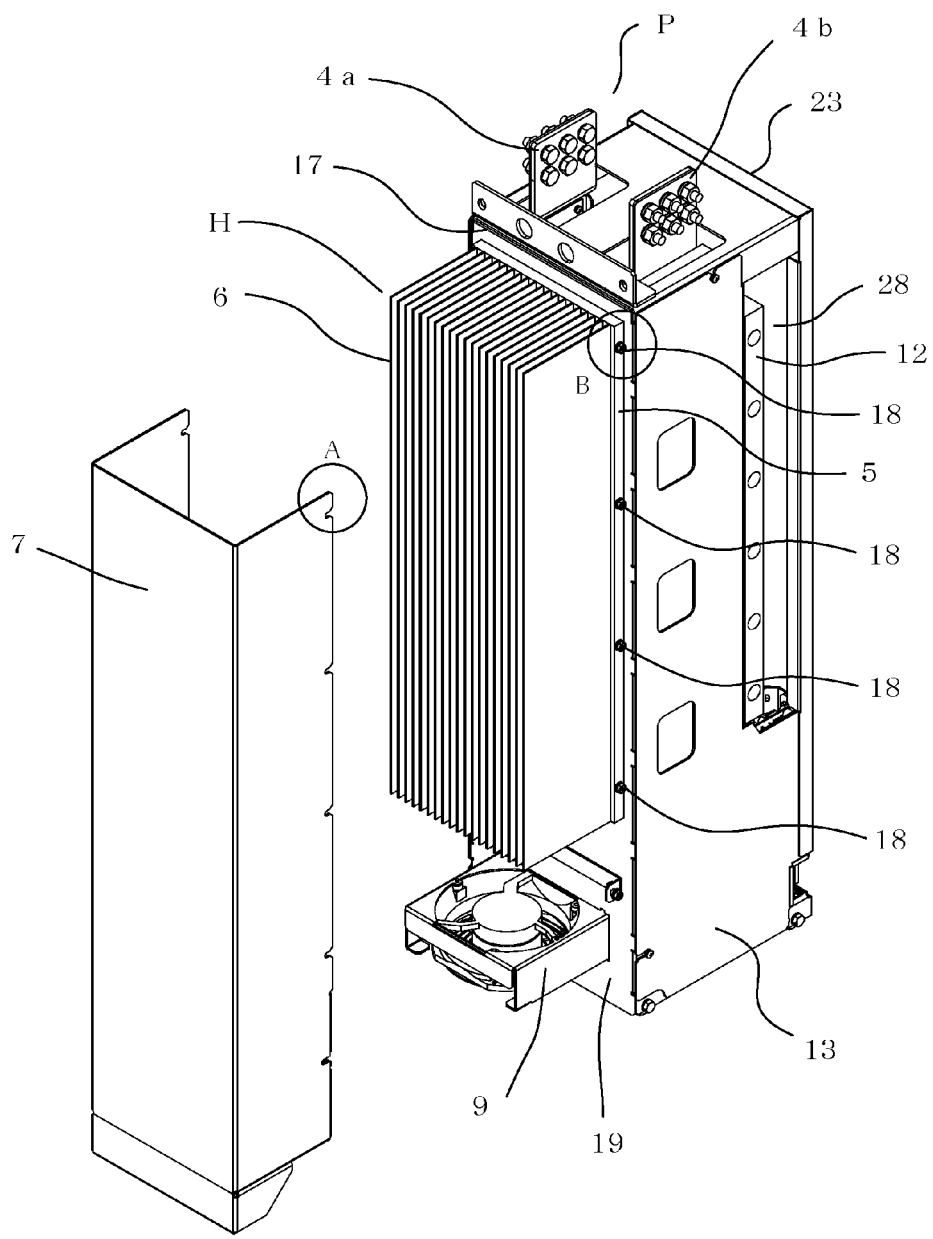
FIG. 7A is a rear perspective view of an electric power converter according to a second embodiment of the present invention.
Figure 7B:
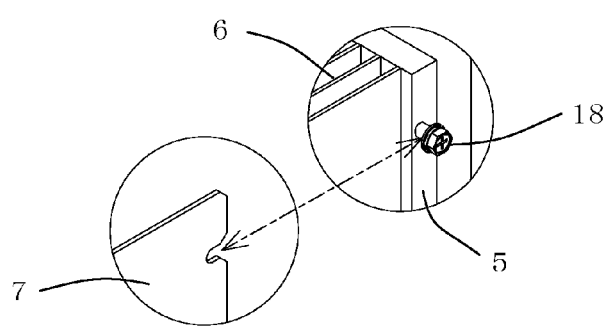
FIG. 7B includes enlarged views of parts A and B shown in FIG. 7A.

FIGS. 7A and 7B show an electric power converter P according to a second embodiment of the present invention. FIG. 7A is a rear perspective view of the electric power converter P. FIG. 7B includes enlarged views of parts A and B shown in FIG. 7A.

Referring to FIGS. 7A and 7B, the wind tunnel 7 having a staple-like shape is secured to the right and left sides of the heat-sink base 5 with screws 18. As shown in FIG. 7B, the wind tunnel 7 has at the edges thereof U-shaped notches for receiving the screws 18. The wind tunnel 7 can be removed by loosening the screws 18 on both sides of the heat-sink base 5.

The cooler 10 and the circuit 11 are separated by the flange plate 19 attached to the heat-sink base 5. The flange plate 19 forms a step 17. The step 17 provides a flat surface having a specific width around the boundary between the cooler 10 and the circuit 11. To install the electric power converter P in the control box such that the cooler 10 is exposed to the outside, the cooler 10 of the electric power converter P is inserted into a hole provided in the back plate of the control box, the hole being of a size sufficient for allowing the wind tunnel 7 to pass therethrough. Then, while the flat surface provided by the step 17 is pressed against the back plate of the control box, the electric power converter P is secured to the control box. Thus, while the inside of the control box is maintained to be airtight, a great cooling effect is provided. If a sealing material such as a gasket is provided on the flat surface, the airtightness is increased. Furthermore, in such an installation state, the wind tunnel 7 at the back of the electric power converter P is accessible from the back of the control box. Therefore, when the wind tunnel 7 is removed by loosening the screws 18 on the sides of the heat-sink base 5, dust particles on the radiator fins 6 can be removed easily from the back of the control box.

To summarize, according to the embodiments of the present invention, the input terminals 1A are provided on the front side of the electric power converter P; wire connection can be performed on both right and left sides of the electric power converter P; the cooler 10 and the circuit 11 are separated in the depth direction of the electric power converter P; and the electric power converter P has the step 17. Thus, an electric power converter that can be installed with the cooler thereof exposed to the outside of the control box is provided in which wiring work can be performed efficiently and to which another electric power converter can be easily connected in parallel.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An electric power converter comprising:
   a flange plate forming a part of a casing and having a rectangular shape with a through-hole provided therein;
   a cooler comprising:
      a heat sink in which a plurality of radiator fins are provided on a heat-sink base fitted in the through-hole of the flange plate;
      a cooling fan configured to feed cooling air through the plurality of radiator fins; and
      a wind tunnel provided on the heat-sink base and covering the plurality of radiator fins and the cooling fan; and
   an electronic circuit comprising:
      a plurality of rectifiers provided on a side of the heat-sink base opposite to the plurality of radiator fins and arranged side by side in a longitudinal direction of the heat-sink base; and
      a plurality of input terminals connected to the plurality of rectifiers with band-shaped conductors and provided on a side of the plurality of rectifiers opposite to the heat sink.

2. The electric power converter according to claim 1, wherein the wind tunnel, the heat-sink base, and the flange plate in combination form a duct, and
wherein the wind tunnel is removably provided on the heat-sink base.

3. The electric power converter according to claim 1, wherein the input terminals are each a band-shaped conductor extending horizontally and having right and left end portions thereof bent, and
wherein the right and left end portions are held by insulators.

4. The electric power converter according to claim 1, wherein wiring openings are provided on right and left sides of the input terminals.

* * * * *